(12) United States Patent
Lee et al.

(10) Patent No.: US 10,081,539 B2
(45) Date of Patent: Sep. 25, 2018

(54) TWO DIFFERENT CONDUCTIVE BUMP STOPS ON CMOS-MEMS BONDED STRUCTURE

(71) Applicant: InvenSense, Inc., San Jose, CA (US)

(72) Inventors: Daesung Lee, San Jose, CA (US); Jeff Huang, Fremont, CA (US); Ki Young Lee, Milpitas, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 15/645,665

(22) Filed: Jul. 10, 2017

(65) Prior Publication Data

US 2018/0016135 A1 Jan. 18, 2018

Related U.S. Application Data

(60) Provisional application No. 62/361,441, filed on Jul. 12, 2016.

(51) Int. Cl.
*B81C 1/00* (2006.01)
*B81B 7/00* (2006.01)

(52) U.S. Cl.
CPC .......... *B81C 1/00238* (2013.01); *B81B 7/007* (2013.01); *B81B 2201/0235* (2013.01); *B81B 2201/0242* (2013.01); *B81B 2207/012* (2013.01); *B81C 1/00269* (2013.01); *B81C 1/00301* (2013.01); *B81C 2203/0109* (2013.01); *B81C 2203/035* (2013.01); *B81C 2203/0792* (2013.01)

(58) Field of Classification Search
CPC ............ B81C 1/00238; B81C 1/00269; B81C 1/00301; B81C 2203/0792; B81C 2203/0109; B81B 2207/012; B81B 7/007
See application file for complete search history.

(56) References Cited

U.S. PATENT DOCUMENTS

| | | | |
|---|---|---|---|
| 9,266,714 B2 | 2/2016 | Shu et al. | |
| 9,365,416 B2 | 6/2016 | Shu et al. | |
| 9,650,241 B2* | 5/2017 | Zhang | B81C 1/00333 |
| 9,731,963 B2* | 8/2017 | Zhang | B81C 1/00246 |
| 2013/0214400 A1 | 8/2013 | Shu et al. | |

(Continued)

OTHER PUBLICATIONS

PCT International Search Report and Written Opinion dated Apr. 6, 2016 in International Application No. PCT/US16/14143. 12 pages.

*Primary Examiner* — Mohsen Ahmadi

(57) ABSTRACT

Provided herein is a method including forming a micro-electro-mechanical system ("MEMS") wafer including a first MEMS device and a second MEMS device. A complementary metal-oxide semiconductor ("CMOS") wafer is formed including a first electrically conductive via and a second electrically conductive via. A layer stack including a first conductive layer, a second conductive layer, and a bond layer is deposited over the first electrically conductive via and the second electrically conductive via. The layer stack is etched to define a first standoff, a second standoff, a third standoff, a first bump stop over the first electrically conductive via, and a second bump stop over the second electrically conductive via. The first bump stop and the second bump stop are etched to remove the bond layer. The first bump stop is further etched to remove the second conductive layer. The MEMS wafer is bonded to the CMOS wafer.

14 Claims, 13 Drawing Sheets

(56) References Cited

U.S. PATENT DOCUMENTS

| | | | |
|---|---|---|---|
| 2013/0285248 A1* | 10/2013 | Yin | H01L 23/49866 257/762 |
| 2014/0042562 A1* | 2/2014 | Chu | B81B 3/0059 257/415 |
| 2014/0151820 A1 | 6/2014 | Howe et al. | |
| 2015/0197419 A1* | 7/2015 | Cheng | B81B 7/0006 257/418 |
| 2016/0264402 A1* | 9/2016 | Yu | B81B 7/0051 |
| 2016/0327446 A1* | 11/2016 | Classen | G01L 9/0073 |
| 2016/0341616 A1* | 11/2016 | Classen | G01L 9/0042 |
| 2016/0376143 A1 | 12/2016 | Shin et al. | |
| 2017/0081173 A1* | 3/2017 | Liu | B81C 1/00182 |
| 2017/0081180 A1* | 3/2017 | Classen | B81B 7/007 |
| 2017/0183222 A1* | 6/2017 | Peng | B81C 1/00238 |
| 2017/0183225 A1* | 6/2017 | Lee | B81C 1/00285 |
| 2017/0217756 A1* | 8/2017 | Hsieh | B81B 3/0005 |
| 2017/0225947 A1* | 8/2017 | Chen | B81C 1/00269 |
| 2017/0247251 A1* | 8/2017 | Chu | B81B 7/02 |
| 2017/0297911 A1* | 10/2017 | Shin, II | B81C 1/00682 |
| 2017/0334711 A1* | 11/2017 | Chang | B81B 7/007 |
| 2017/0341933 A1* | 11/2017 | Shen | B81C 1/00825 |
| 2017/0355598 A1* | 12/2017 | Chou | B81C 1/00595 |
| 2017/0363694 A1* | 12/2017 | Boysel | G01R 33/0286 |
| 2018/0029881 A1* | 2/2018 | Cheng | B81C 1/0023 |
| 2018/0074090 A1* | 3/2018 | Boysel | G01P 15/097 |

\* cited by examiner

1200

```
┌─────────────────────────────────────────────────────────────────────────┐
│  Forming a MEMS wafer including a first MEMS device and a second MEMS device │
│                                  1202                                    │
└─────────────────────────────────────────────────────────────────────────┘
                                    │
┌─────────────────────────────────────────────────────────────────────────┐
│    Forming a CMOS wafer including a first electrically conductive via and a second │
│                         electrically conductive via                      │
│                                  1204                                    │
└─────────────────────────────────────────────────────────────────────────┘
                                    │
┌─────────────────────────────────────────────────────────────────────────┐
│  Depositing a layer stack including a first conductive layer, a second conductive layer, and a │
│  bond pad layer over the first electrically conductive via and the second electrically │
│                            conductive via                                │
│                                  1206                                    │
└─────────────────────────────────────────────────────────────────────────┘
                                    │
┌─────────────────────────────────────────────────────────────────────────┐
│   Etching the layer stack to define a first standoff, a second standoff, a third standoff, a first │
│   bump stop over the first electrically conductive via, and a second bump stop over the second │
│                          electrically conductive via                     │
│                                  1208                                    │
└─────────────────────────────────────────────────────────────────────────┘
                                    │
┌─────────────────────────────────────────────────────────────────────────┐
│     Etching the first bump stop and the second bump stop to remove the bond pad layer │
│                                  1210                                    │
└─────────────────────────────────────────────────────────────────────────┘
                                    │
┌─────────────────────────────────────────────────────────────────────────┐
│          Further etching the first bump stop to remove the second conductive layer │
│                                  1212                                    │
└─────────────────────────────────────────────────────────────────────────┘
                                    │
┌─────────────────────────────────────────────────────────────────────────┐
│              Eutecticly bonding a MEMS wafer to the CMOS wafer           │
│                                  1214                                    │
└─────────────────────────────────────────────────────────────────────────┘
```

```
┌─────────────────────────────────────────────────────────────────────────────┐
│ Depositing a layer stack on a CMOS wafer, wherein the layer stack includes a first │
│ conductive layer and a second conductive layer over a first electrically conductive via and a │
│                      second electrically conductive via                      │
│                                   1302                                       │
└─────────────────────────────────────────────────────────────────────────────┘
```

Etching the layer stack to remove the second conductive layer over the first electrically conductive via to expose a portion of the first conductive layer over the first electrically conductive via
1304

Depositing a bond pad layer over the second conductive layer and the exposed portion of the first conductive layer
1306

Etching the bond pad layer, the first conductive layer, and the second conductive layer to form: a first standoff, a second standoff, and a third standoff, wherein the first standoff, the second standoff and the third standoff include portions of the first conductive layer, the second conductive layer, and the bond pad layer; a first bump stop over the first electrically conductive via, wherein the first bump stop includes portions of the first conductive layer and the bond pad layer; and a second bump stop over the second electrically conductive via, wherein the second bump stop includes portions of the first conductive layer, the second conductive layer, and the bond pad layer
1308

Removing the bond pad layer from the first bump stop and the second bump stop
1310

Eutecticly bonding a MEMS wafer to the CMOS wafer
1312

FIG. 13

TWO DIFFERENT CONDUCTIVE BUMP STOPS ON CMOS-MEMS BONDED STRUCTURE

CROSS-REFERENCE TO RELATED APPLICATIONS

This application claims the benefit of U.S. Provisional Patent Application Ser. No. 62/361,441 filed Jul. 12, 2016, entitled "METHOD OF FABRICATING TWO DIFFERENT CONDUCTIVE BUMP S TOP ON CMOS-MEMS BONDING STRUCTURE".

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer.

SUMMARY

Provided herein is a method including forming MEMS wafer including a first MEMS device and a second MEMS device. A CMOS wafer is formed including a first electrically conductive via and a second electrically conductive via. A layer stack including a first conductive layer, a second conductive layer, and a bond layer is deposited over the first electrically conductive via and the second electrically conductive via. The layer stack is etched to define a first standoff, a second standoff, a third standoff, a first bump stop over the first electrically conductive via, and a second bump stop over the second electrically conductive via. The first bump stop and the second bump stop are etched to remove the bond layer. The first bump stop is further etched to remove the second conductive layer. The MEMS wafer is bonded to the CMOS wafer. These and other features and advantages will be apparent from a reading of the following detailed description.

BRIEF DESCRIPTION OF DRAWINGS

FIG. 12 shows an exemplary flow diagram for forming two different conductive bump stops on a CMOS-MEMS bonded structure according to one aspect of the present embodiments.

FIG. 13 shows another exemplary flow diagram for forming two different conductive bump stops on a CMOS-MEMS bonded structure according to one aspect of the present embodiments.

DESCRIPTION

Figure 1:
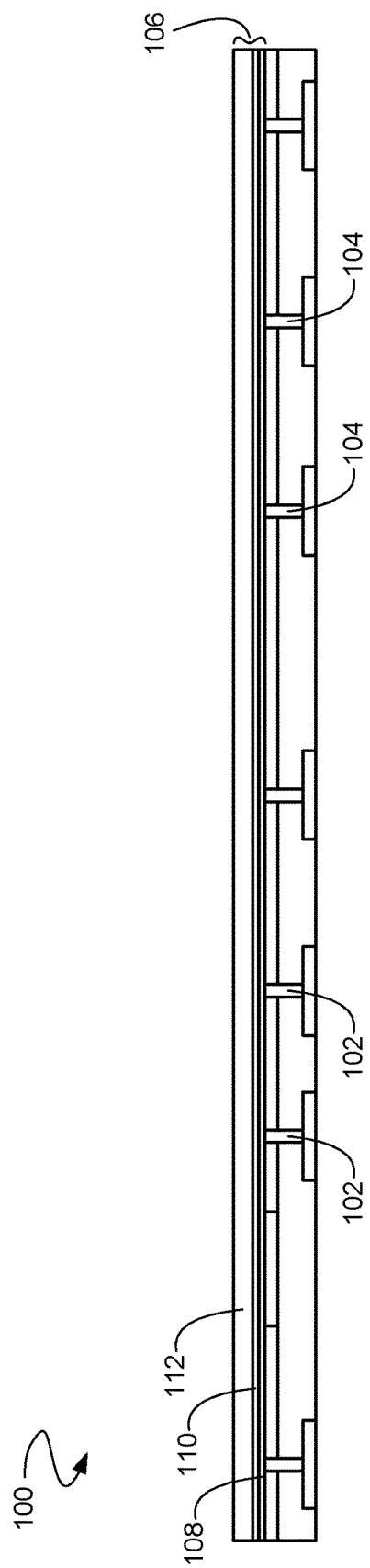
FIG. 1 shows a CMOS wafer undergoing manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A micro-electro-mechanical systems ("MEMS") device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer. The different MEMS devices may include mechanical elements that work best with different electrodes on a complementary metal-oxide semiconductor ("CMOS") wafer. For example, a gyroscope MEMS device may optimally operate with a first electrode on a CMOS wafer, and an accelerometer MEMS device my optimally operate with a second electrode on the same CMOS wafer. According to embodiments described herein, the first and second electrodes on the same CMOS wafer include different thickness and/or compositions that are optimized for the corresponding MEMS devices. As such, it is desirable during fabrication to create various different MEMS devices on a MEMS wafer with different corresponding electrodes on the same CMOS wafer.

Referring now to FIG. 1, a CMOS wafer 100 undergoing manufacture is shown according to one aspect of the present embodiments. The CMOS wafer 100 includes first electrically conductive vias 102 and second electrically conductive vias 104. The first and second electrically conductive vias (102, 104) include an electrically conductive material (e.g. tungsten, etc.). In various embodiments, the first and second electrically conductive vias (102, 104) also include (not shown) a barrier metal (e.g. Ti, TiN, etc.) along the edges and surrounding the electrically conductive material.

A layer stack 106 has been deposited over the first electrically conductive vias 102 and the second electrically conductive vias 104. In various embodiments, the layer stack 106 may be deposited by any method, including, but not limited to, physical vapor deposition ("PVD") and chemical vapor deposition ("CVD"). The layer stack 106 includes a first conductive layer 108, a second conductive layer 110, and a bond layer 112. The second conductive layer 110 overlies the first conductive layer 108, and the bond layer 112 overlies the second conductive layer 110.

The first conductive layer 108 may include any kind of bi-layer materials (e.g. Ti, TiN, etc.), and the second conductive layer 110 may include any kind of bi-layer materials (e.g. Ti, TiN, etc.). In different embodiments, the first conductive layer 108 and the second conductive layer 110 may include the same or different materials. The bond layer 112 may include an electrically conductive material (e.g. aluminum, etc.).

Figure 2:
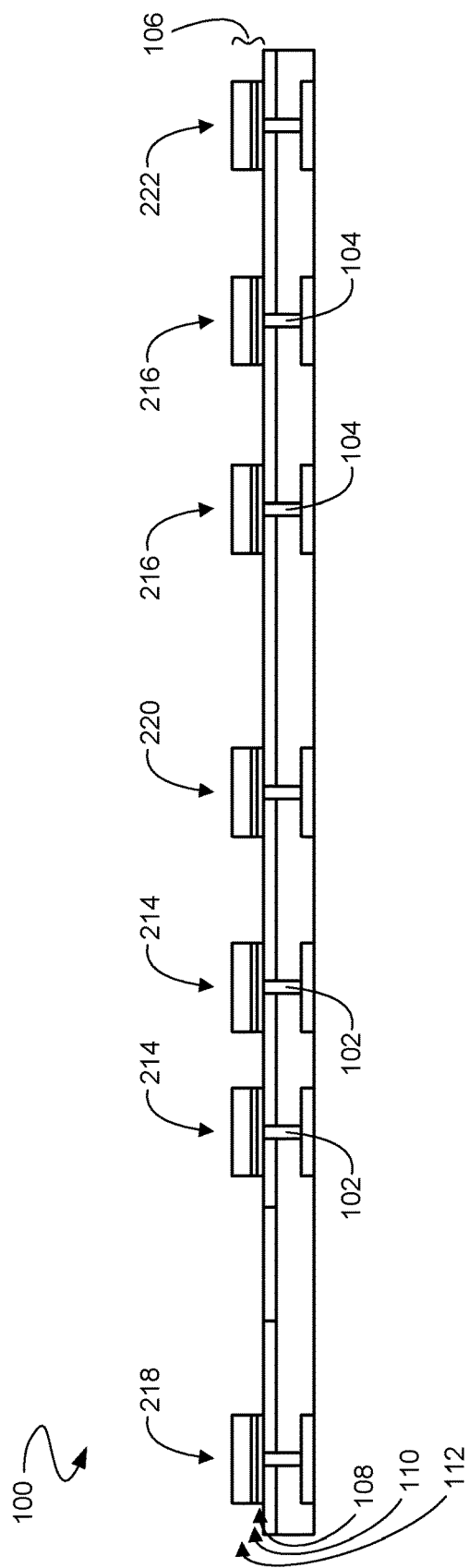
FIG. 2 shows the CMOS wafer after patterning according to one aspect of the present embodiments.

Referring now to FIG. 2, the CMOS wafer 100 after patterning is shown according to one aspect of the present embodiments. The layer stack 106 of the CMOS wafer 100 has been patterned into first bump stops 214, second bump stops 216, a first standoff 218, a second standoff 220, and a third standoff 222. In various embodiments, any patterning technique may be used. For example, a reactive ion etch with a photoresist mask may be used to etch the layer stack 106. Although embodiments are described with respect to the first standoff 218, the second standoff 220, and the third standoff 222, it is understood that any number of standoffs may be present.

After patterning, the first bump stops 214, the second bump stops 216, the first standoff 218, the second standoff 220, and the third standoff 222 all include portions of the first conductive layer 108, the second conductive layer 110, and the bond layer 112. In addition, after patterning, the first bump stops 214 are over the first electrically conductive vias 102, and the second bump stops 216 are over the second electrically conductive vias 104.

Figure 3:
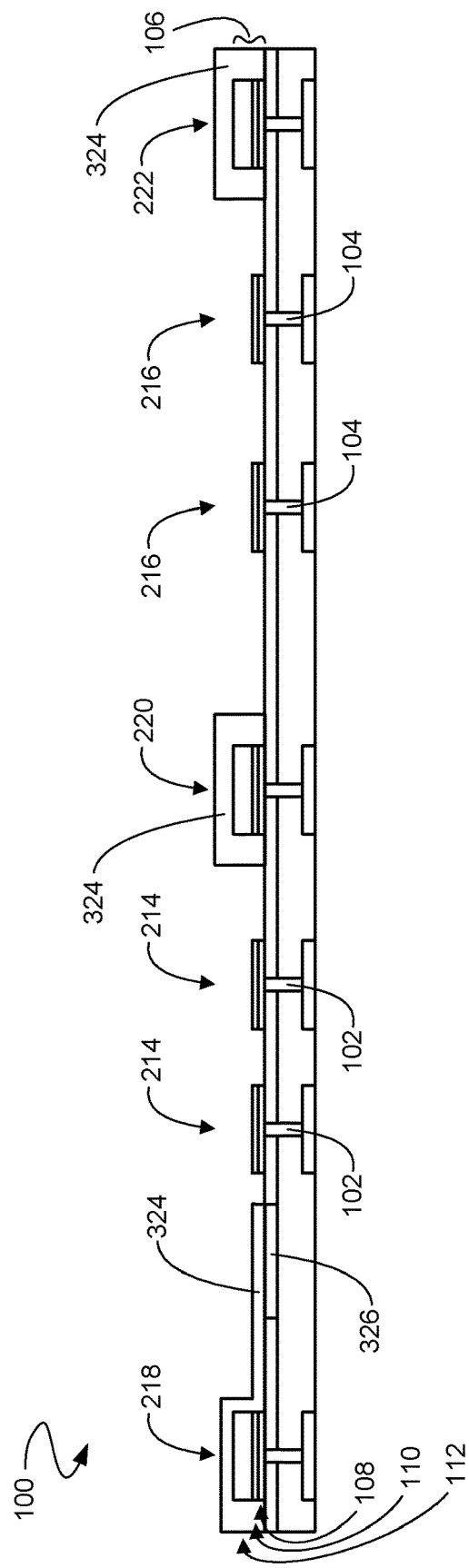
FIG. 3 shows the CMOS wafer after selective etching according to one aspect of the present embodiments.

Referring now to FIG. 3, the CMOS wafer 100 after selective etching is shown according to one aspect of the present embodiments. The portions of the bond layer 112 of the first bump stops 214 and the portions of the bond layer 112 of the second bump stops 216 are removed, for example by etching (e.g. wet etch, etc.), to expose the portions of the second conductive layer 110 of the first and second bump stops (214, 216).

In various embodiments, the first standoff 218, the second standoff 220, and the third standoff 222 are all protected by, for example, a photoresist mask 324. The photoresist mask 324 is deposited over the first standoff 218, the second standoff 220, and the third standoff 222 prior to the selective etching of the first bump stops 214 and the second bump stops 216. In some embodiments, the photoresist mask 324 also protects other areas and components of the CMOS wafer 100. For example, the photoresist mask 324 may protect a outgassing material 326.

Figure 4:
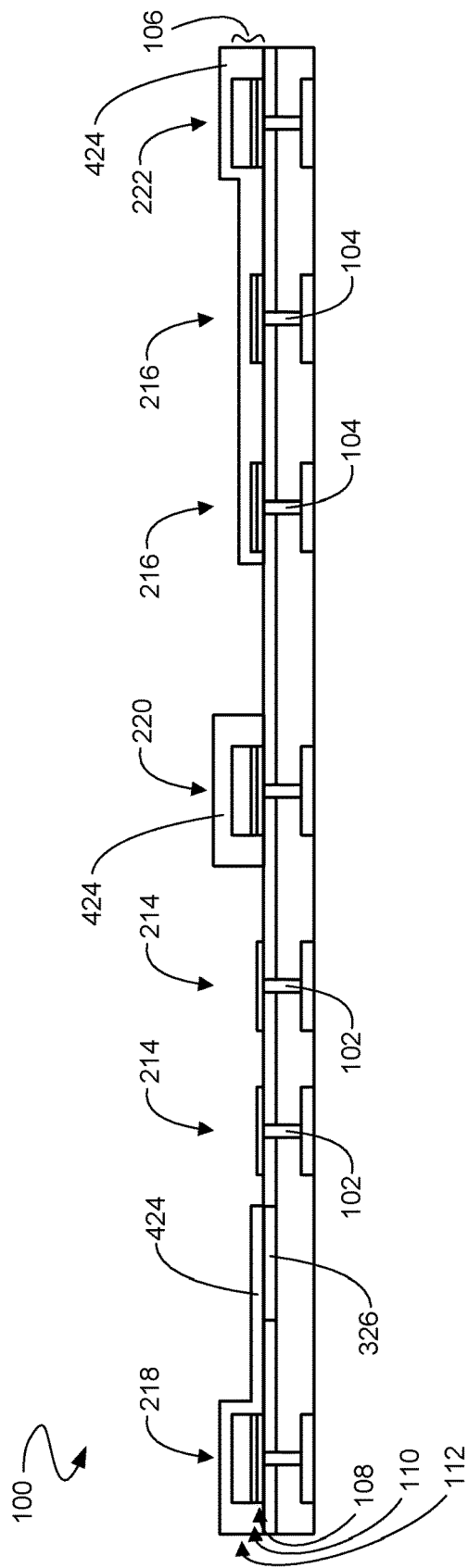
FIG. 4 shows the CMOS wafer after further selective etching according to one aspect of the present embodiments.

Referring now to FIG. 4, the CMOS wafer 100 after further selective etching is shown according to one aspect of the present embodiments. The remaining portions of the second conductive layer 110 of the first bump stops 214 are removed, for example by etching (e.g. reactive ion etch, etc.), to expose the portions of the first conductive layer 108 of the first bump stops 214.

In various embodiments, the first standoff 218, the second standoff 220, the third standoff 222, and the second bump stops 216 are all protected by, for example, a photoresist mask 424. The photoresist mask 424 is deposited over the first standoff 218, the second standoff 220, the third standoff 222, and the second bump stops 216 prior to the further selective etching of the first bump stops 214. In some embodiments, the photoresist mask 424 also protects other areas and components of the CMOS wafer 100. For example, the photoresist mask 424 may protect the outgassing material 326. As a result of the further selective etching, the first bump stops 214 include a single layer containing the first conductive layer 108. In addition, the second bump stops 216 include a double layer containing the first conductive layer 108 and the second conductive layer 110.

Figure 5:
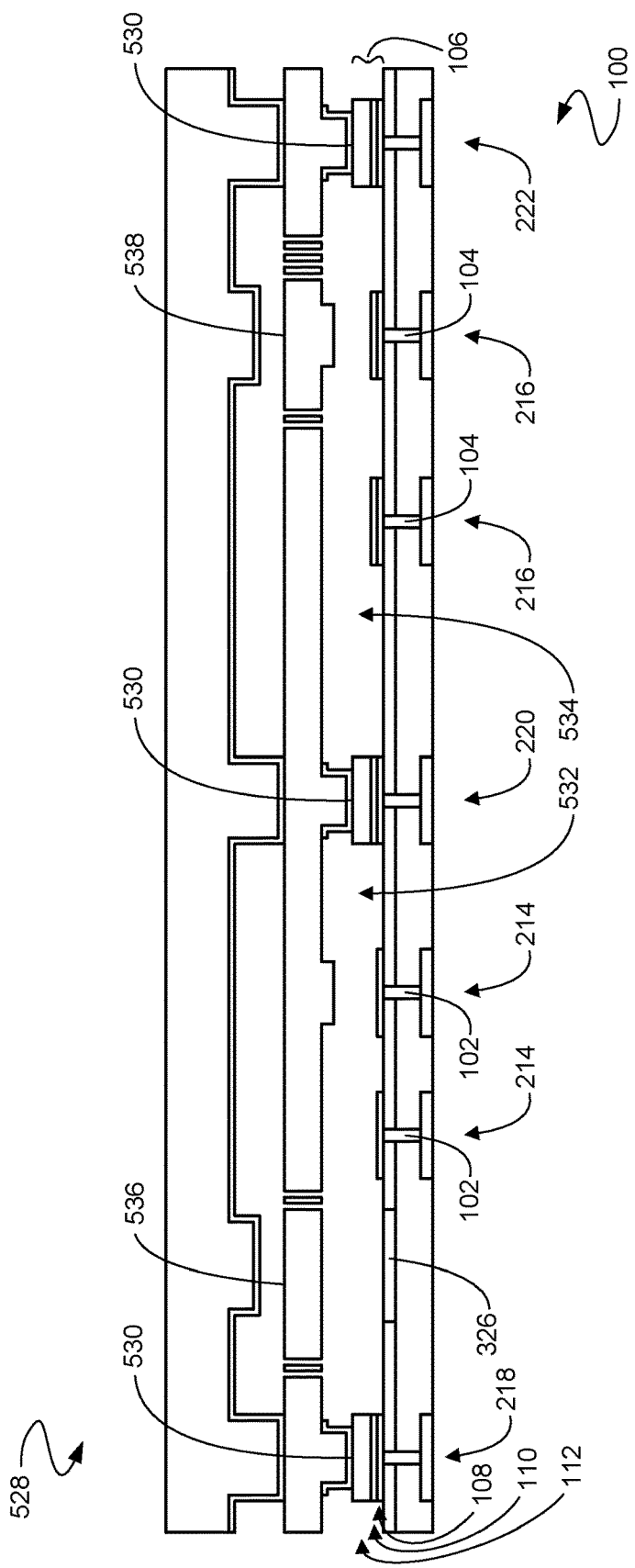
FIG. 5 shows the CMOS wafer bonded to a MEMS wafer including a first MEMS device and a second MEMS device according to one aspect of the present embodiments.

Referring now to FIG. 5, the CMOS wafer 100 bonded to a MEMS wafer 528 including a first MEMS device 536 and a second MEMS device 538 is shown according to one aspect of the present embodiments. In various embodiments, the first standoff 218, the second standoff 220, and the third standoff 222 of the CMOS wafer 100 eutecticly bond the CMOS wafer 100 to the MEMS wafer 528 with eutectic bonds 530. However, it is understood that the bonds are not limited to eutectic bonding, and in some embodiments any bonding method may be used to bond the CMOS wafer 100 to the MEMS wafer 528. As such, the CMOS wafer 100 underlies the MEMS wafer 528.

The eutectic bonding of the CMOS wafer 100 to the MEMS wafer 528 forms a first cavity 532 and a second cavity 534. The first cavity 532 and the second cavity 534 are defined by the CMOS wafer 100 and the MEMS wafer 528. The first cavity 532 surrounds the first MEMS device 536 and the first bump stops 214. The second cavity 534 surrounds the second MEMS device 538 and the second bump stops 216.

The first MEMS device 536 and the second MEMS device 538 may be any MEMS device (e.g. gyroscope, accelerometer, magnetometer, pressure sensor, etc.), and may include the same MEMS devices or different MEMS devices. For example, the first MEMS device 536 may be an accelerometer and the second MEMS device 538 may be a gyroscope. In various embodiments, the first cavity 532 and the second cavity 534 are sealed, for example, by the eutectic bonds. As a result of the sealing, the first MEMS device 536 may include a first gas pressure and the second MEMS device 538 may include a second gas pressure. In various embodiments, the first gas pressure and the second gas pressure may be different or the same, and one or both of the pressures may be a vacuum.

FIG. 5 depicts an embodiment wherein the second standoff 220 is a shared boundary between both the first cavity 532 of the first MEMS device 536 and the second cavity 534 of the second MEMS device 538. As such, the first MEMS device 536 is between the first standoff 218 and the second standoff 220. In addition, the second MEMS device 538 is between the second standoff 220 and the third standoff 222. In other embodiments, the first MEMS device 536 and the second MEMS device 538 may not share the second standoff 220. For example, the first MEMS device 536 and the second MEMS device 538 may each use separate standoffs (not shown).

As described above, the first bump stops 214 include a single layer (e.g. the first conductive layer 108) with a first height. In addition, the second bump stops 216 include a double layer (e.g. the first conductive layer 108 and the second conductive layer 110) with a second height that is larger than the first height. Furthermore, the first bump stops 214 and the second bump stops 216 may include any number of layers, and the number of layers may be different or equal. In various embodiments, the first bump stops 214 and the second bump stops 216 may perform any number of similar or different functions. For example, one or more of the first bump stops 214 and the second bump stops 216 may function as sensing electrodes, shield electrodes, etc.

In further embodiments, the first cavity 532 of the first MEMS device 536 may include one or more of the first bump stops 214 as well as one or more of the second bump stops 216. In addition, the second cavity 534 of the second MEMS device 538 may include one or more of the first bump stops 214 as well as one or more of the second bump stops 216. Therefore, it is understood that by using the masking and etching described herein, any combination of first bump stops 214 and second bump stops 216 may be formed within one or more cavities associated with one or more MEMS devices.

Figure 6:
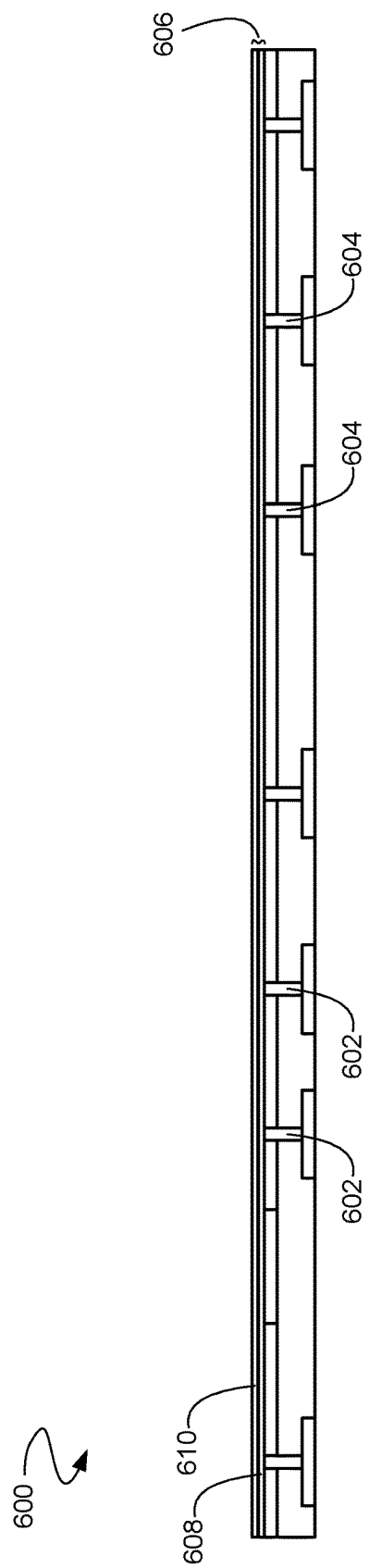
FIG. 6 shows a CMOS wafer undergoing manufacture according to one aspect of the present embodiments.

Referring now to FIG. 6 a CMOS wafer 600 undergoing manufacture is shown according to one aspect of the present embodiments. The CMOS wafer 600 includes first electrically conductive vias 602 and second electrically conductive vias 604. The first and second electrically conductive vias (602, 604) include an electrically conductive material (e.g. tungsten, etc.). In various embodiments, the first and second electrically conductive vias (602, 604) also include (not shown) a barrier metal (e.g. Ti, TiN, etc.) along the edges and surrounding the electrically conductive material.

A layer stack 606 has been deposited over the first electrically conductive vias 602 and the second electrically conductive vias 604. In various embodiments, the layer stack 606 may be deposited by any method, including, but not limited to, physical vapor deposition ("PVD") and chemical vapor deposition ("CVD"). The layer stack 606 includes a first conductive layer 608 and a second conductive layer 610. The second conductive layer 610 overlies the first conductive layer 608.

The first conductive layer 608 may include any kind of bi-layer materials (e.g. Ti, TiN, etc.), and the second conductive layer 610 may include any kind of bi-layer materials (e.g. Ti, TiN, etc.). In different embodiments, the first conductive layer 608 and the second conductive layer 610 may include the same or different materials.

Figure 7:
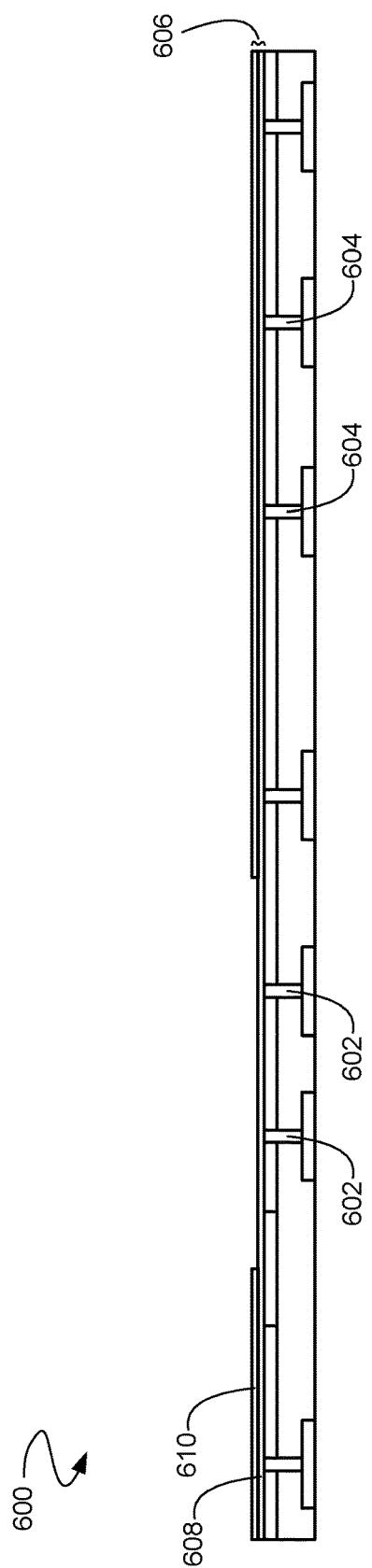
FIG. 7 shows the CMOS wafer after patterning according to one aspect of the present embodiments.

Referring now to FIG. 7, the CMOS wafer 600 after patterning is shown according to one aspect of the present embodiments. The layer stack 606 of the CMOS wafer 600 has been patterned to remove portions of the second conductive layer 610 over the first electrically conductive vias 602. In various embodiments, any patterning technique may be used. For example, a dry or wet etch with a photoresist mask or hard mask may be used to etch the layer stack 606. As a result of the patterning, the layer stack 606 includes exposed portions of both the first conductive layer 608 and the second conductive layer 610.

Figure 8:
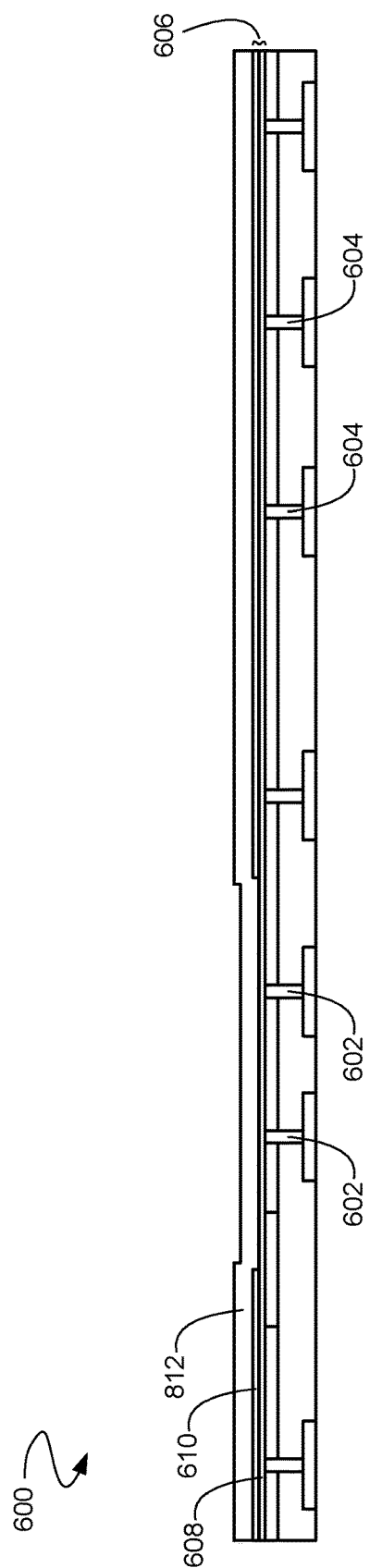
FIG. 8 shows the CMOS wafer after deposition of a bond layer according to one aspect of the present embodiments.

Referring now to FIG. 8, the CMOS wafer 600 after deposition of a bond layer 812 is shown according to one aspect of the present embodiments. In various embodiments, the bond layer 812 may be deposited by any known deposition technique, and overlies the exposed portions of both the first conductive layer 608 and the second conductive layer 610. The bond layer 812 may include an electrically conductive material (e.g. aluminum, etc.).

Figure 9:
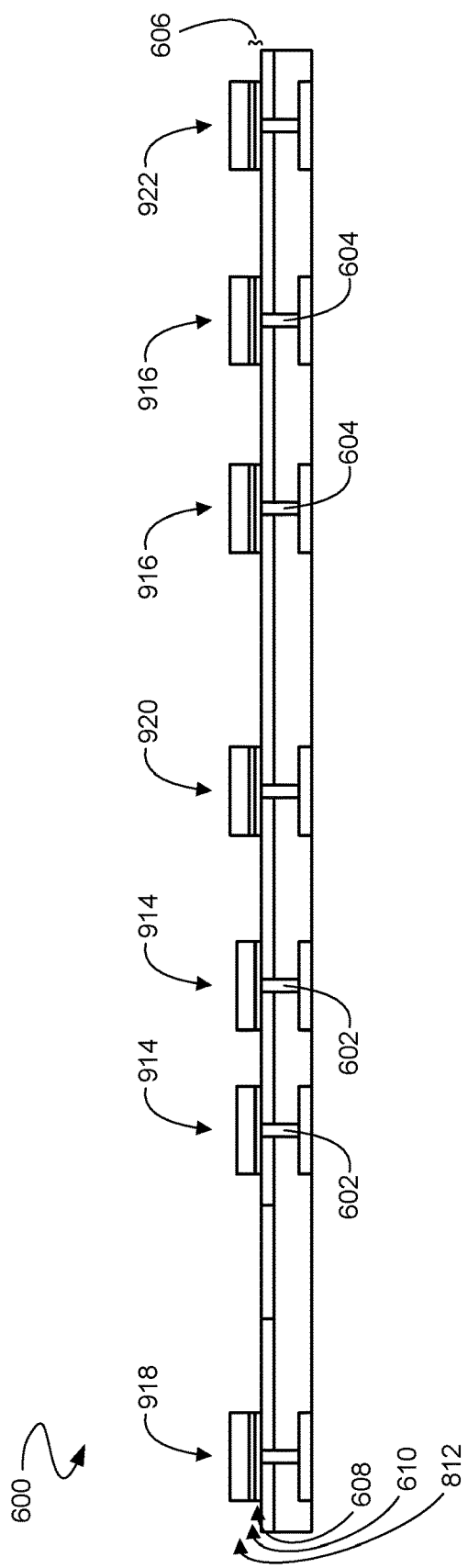
FIG. 9 shows the CMOS wafer after patterning the first conductive layer, the second conductive layer, and the bond layer according to one aspect of the present embodiments.

Referring now to FIG. 9, the CMOS wafer 100 after patterning the first conductive layer 608, the second conductive layer 610, and the bond layer 812 is shown according to one aspect of the present embodiments. Portions of the first conductive layer 608 and the bond layer 812 have been patterned into first bump stops 914. In addition, portions of the first conductive layer 608, the second conductive layer 610 and the bond layer 812 have been patterned into second bump stops 916, a first standoff 918, a second standoff 920, and a third standoff 922. In various embodiments, any patterning technique may be used. For example, a reactive ion etch with a photoresist mask may be used. Although embodiments are described with respect to the first standoff 918, the second standoff 920, and the third standoff 922, it is understood that any number of standoffs may be present.

After patterning, the first bump stops 914 include portions of the first conductive layer 608 and the bond layer 812. Furthermore, the second bump stops 916, the first standoff 918, the second standoff 920, and the third standoff 922 all include portions of the first conductive layer 108, the second conductive layer 110, and the bond layer 812. In addition, after patterning, the first bump stops 914 are over the first electrically conductive vias 102, and the second bump stops 916 are over the second electrically conductive vias 104. In some embodiments, at least one of the first standoff 918, the second standoff 920, and the third standoff 922 may be made of the first conductive layer 108 and the bond layer 812.

Figure 10:
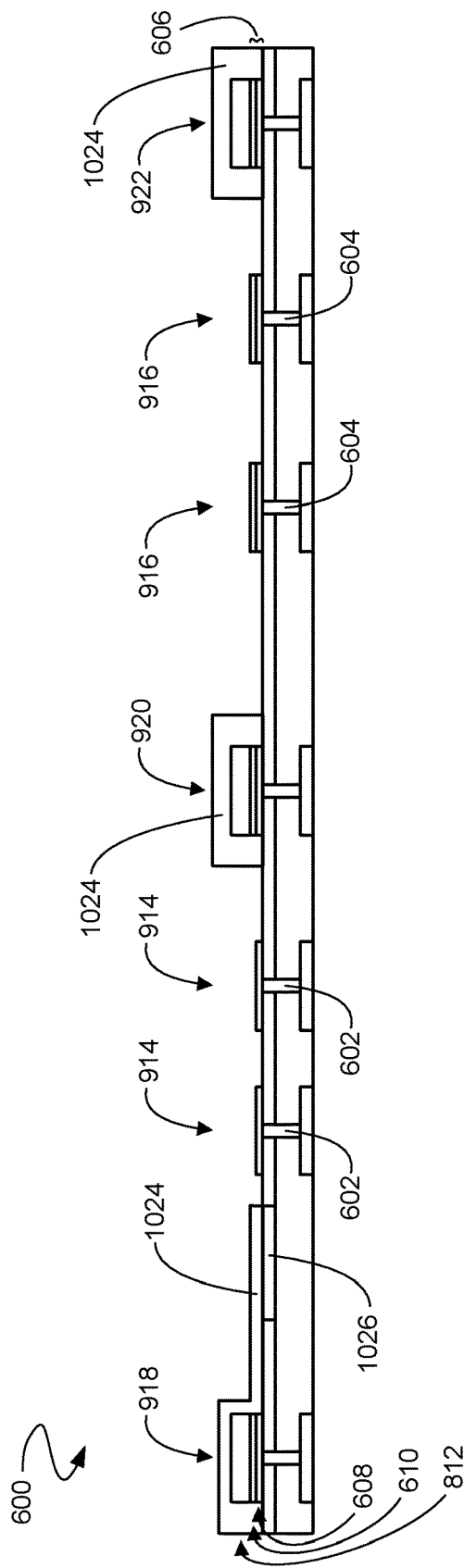
FIG. 10 shows the CMOS wafer after selective etching according to one aspect of the present embodiments.

Referring now to FIG. 10, the CMOS wafer 600 after selective etching is shown according to one aspect of the present embodiments. The portions of the bond layer 812 of the first bump stops 914 and the portions of the bond layer 812 of the second bump stops 916 are removed, for example by etching (e.g. wet etch, etc.), to expose the portions of the first conductive layer 608 of the first bump stops 914 and portions of the second conductive layer 610 of the second bump stops 916. As a result of the selective etching, the first bump stops 914 include a single layer containing the first conductive layer 608. In addition, the second bump stops 916 include a double layer containing the first conductive layer 608 and the second conductive layer 610.

In various embodiments, the first standoff 918, the second standoff 920, and the third standoff 922 are all protected by, for example, a photoresist mask 1024. The photoresist mask 1024 is deposited over the first standoff 918, the second standoff 920, and the third standoff 922 prior to the selective etching of the first bump stops 914 and the second bump stops 916. In some embodiments, the photoresist mask 1024 also protects other areas and components of the CMOS wafer 600. For example, the photoresist mask 1024 may protect a outgassing material 1026.

Figure 11:
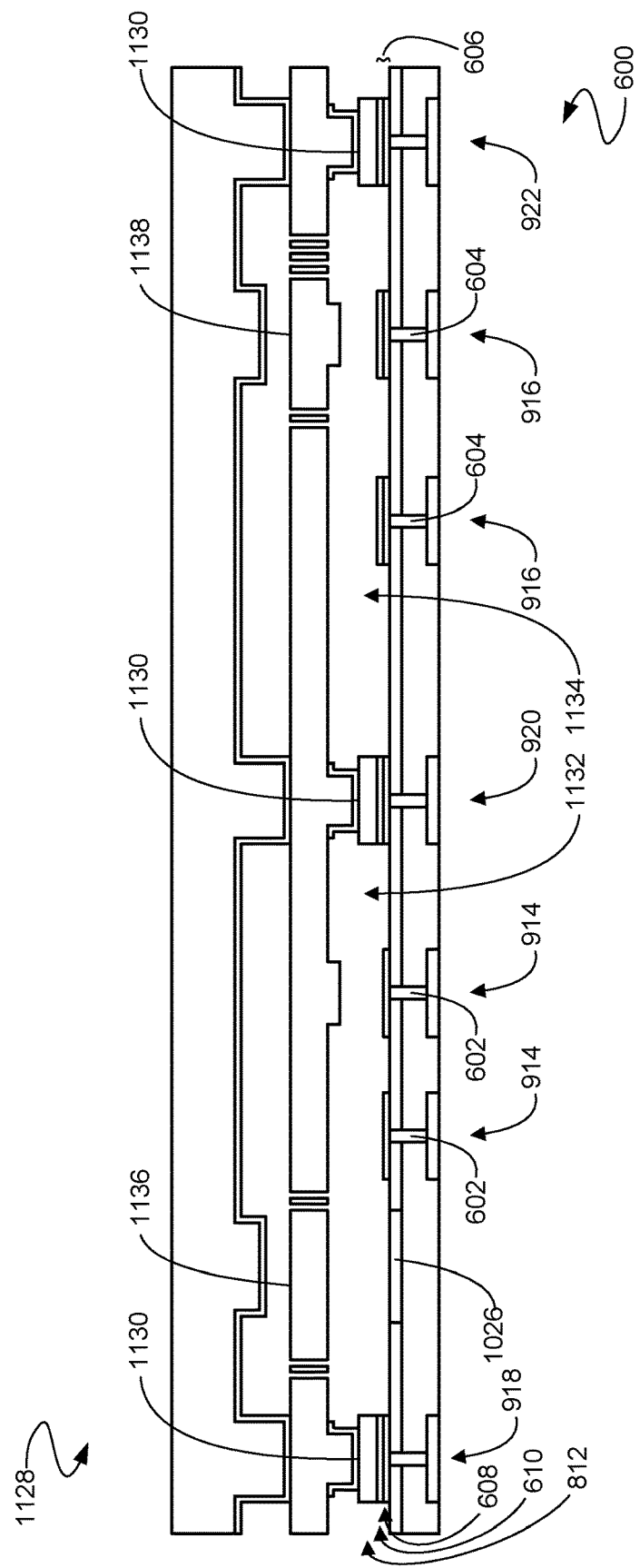
FIG. 11 shows the CMOS wafer bonded to a MEMS wafer including a first MEMS device and a second MEMS device according to one aspect of the present embodiments.

Referring now to FIG. 11, the CMOS wafer 600 bonded to a MEMS wafer 1128 including a first MEMS device 1136 and a second MEMS device 1138 is shown according to one aspect of the present embodiments. In various embodiments, the first standoff 918, the second standoff 920, and the third standoff 922 of the CMOS wafer 600 eutecticly bond the CMOS wafer 600 to the MEMS wafer 1128 with eutectic bonds 1130. However, it is understood that the bonds are not limited to eutectic bonding, and in some embodiments any bonding method may be used to bond the CMOS wafer 600 to the MEMS wafer 1128. As such, the CMOS wafer 600 underlies the MEMS wafer 1128.

The eutectic bonding of the CMOS wafer 600 to the MEMS wafer 1128 forms a first cavity 1132 and a second cavity 1134. The first cavity 1132 and the second cavity 1134 are defined by the CMOS wafer 600 and the MEMS wafer 1128. The first cavity 1132 surrounds the first MEMS device 1136 and the first bump stops 914. The second cavity 1134 surrounds the second MEMS device 1138 and the second bump stops 916.

The first MEMS device 1136 and the second MEMS device 1138 may be any MEMS device (e.g. gyroscope, accelerometer, magnetometer, pressure sensor, etc.), and may include the same MEMS devices or different MEMS devices. For example, the first MEMS device 1136 may be an accelerometer and the second MEMS device 1138 may be a gyroscope. In various embodiments, the first cavity 1132 and the second cavity 1134 are sealed, for example, by the eutectic bonds. As a result of the sealing, the first MEMS device 1136 may include a first gas pressure and the second MEMS device 1138 may include a second gas pressure. In various embodiments, the first gas pressure and the second gas pressure may be different or the same, and one or both of the pressures may be a vacuum.

FIG. 11 depicts an embodiment wherein the second standoff 920 is a shared boundary between both the first cavity 1132 of the first MEMS device 1136 and the second cavity 1134 of the second MEMS device 1138. As such, the first MEMS device 1136 is between the first standoff 918 and the second standoff 920. In addition, the second MEMS device 1138 is between the second standoff 920 and the third standoff 922. In other embodiments, the first MEMS device 1136 and the second MEMS device 1138 may not share the second standoff 920. For example, the first MEMS device 1136 and the second MEMS device 1138 may each use separate standoffs (not shown).

As described above, the first bump stops 914 include a single layer (e.g. the first conductive layer 608) with a first height. In addition, the second bump stops 916 include a double layer (e.g. the first conductive layer 608 and the second conductive layer 610) with a second height that is larger than the first height. Furthermore, the first bump stops 914 and the second bump stops 916 may include any number of layers, and the number of layers may be different or equal. In various embodiments, the first bump stops 914 and the second bump stops 916 may perform any number of similar or different functions. For example, one or more of the first bump stops 914 and the second bump stops 916 may function as sensing electrodes, shield electrodes, etc.

In further embodiments, the first cavity 1132 of the first MEMS device 1136 may include one or more of the first bump stops 914 as well as one or more of the second bump stops 916. In addition, the second cavity 1134 of the second MEMS device 1138 may include one or more of the first bump stops 914 as well as one or more of the second bump stops 916. Therefore, it is understood that by using the masking and etching described herein, any combination of first bump stops 914 and second bump stops 916 may be formed within one or more cavities associated with one or more MEMS devices.

FIG. 12 shows an exemplary flow diagram 1200 for forming two different conductive bump stops on a CMOS-MEMS bonded structure according to one aspect of the present embodiments. At a block 1202, a MEMS wafer is formed including a first MEMS device and a second MEMS device. At a block 1204, a CMOS wafer is formed including a first electrically conductive via and a second electrically conductive via. At a block 1206, a layer stack including a first conductive layer, a second conductive layer, and a bond layer is deposited over the first electrically conductive via and the second electrically conductive via. At a bock 1208, the layer stack is etched to define a first standoff, a second standoff, a third standoff, a first bump stop over the first electrically conductive via, and a second bump stop over the second electrically conductive via. At a block 1210, the first bump stop and the second bump stop are etched to remove the bond layer. At a block 1212, the first bump stop is further etched to remove the second conductive layer. At a block 1214, the MEMS wafer is eutecticly bonded to the CMOS wafer.

FIG. 13 shows another exemplary flow diagram 1300 for forming two different conductive bump stops on a CMOS-MEMS bonded structure according to one aspect of the present embodiments. At a block 1302, a layer stack is deposited on a CMOS wafer, wherein the layer stack includes a first conductive layer and a second conductive layer over a first electrically conductive via and a second electrically conductive via. At a block 1304, the layer stack is etched to remove the second conductive layer over the first electrically conductive via to expose a portion of the first conductive layer over the first electrically conductive via. At a block 1306, a bond layer is deposited over the second conductive layer and the exposed portion of the first conductive layer. At a bock 1308, the bond layer, the first conductive layer, and the second conductive layer are etched to form: a first standoff, a second standoff, and a third standoff, wherein the first standoff, the second standoff and the third standoff include portions of the first conductive layer, the second conductive layer, and the bond layer; a first bump stop over the first electrically conductive via, wherein the first bump stop includes portions of the first conductive layer and the bond layer; and a second bump stop over the second electrically conductive via, wherein the second bump stop includes portions of the first conductive layer, the second conductive layer, and the bond layer. At a block 1310, the bond layer is removed from the first bump stop and the second bump stop. At a block 1312, a MEMS wafer is eutecticly bonded to the CMOS wafer.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein.

The implementations described above and other implementations are within the scope of the following claims.

What is claimed is:

1. A method, comprising:
forming a micro-electro-mechanical system ("MEMS") wafer including a first MEMS device and a second MEMS device;
forming a complementary metal-oxide semiconductor ("CMOS") wafer including a first electrically conductive via and a second electrically conductive via;
depositing a layer stack including a first conductive layer, a second conductive layer, and a bond layer over the first electrically conductive via and the second electrically conductive via;
etching the layer stack to define a first standoff, a second standoff, a third standoff, a first bump stop over the first electrically conductive via, and a second bump stop over the second electrically conductive via;
etching the first bump stop and the second bump stop to remove the bond layer;
further etching the first bump stop to remove the second conductive layer; and bonding the MEMS wafer to the CMOS wafer;
wherein the bonding the MEMS wafer to the CMOS wafer includes eutecticly bonding the first standoff, the second standoff, and the third standoff to the MEMS wafer;
wherein the eutecticly bonding the MEMS wafer to the CMOS wafer forms a first cavity surrounding the first MEMS device and the first bump stop, and a second cavity surrounding the second MEMS device and the second bump stop.

2. The method of claim 1, further comprising depositing a photoresist over the first standoff, the second standoff, and the third standoff, prior to the etching the first bump stop and the second bump stop.

3. The method of claim 1, further comprising depositing a photoresist over the second bump stop, prior to the further etching the first bump stop.

4. The method of claim 1, wherein the first cavity includes a first gas pressure and the second cavity includes a second gas pressure.

5. The method of claim 1, wherein
the first MEMS device is between the first standoff and the second standoff, and
the second MEMS device is between the second standoff and the third standoff.

6. A method, comprising:
depositing a layer stack on a complementary metal-oxide semiconductor ("CMOS") wafer, wherein the layer stack includes a first conductive layer and a second conductive layer over a first electrically conductive via and a second electrically conductive via;
etching the layer stack to remove the second conductive layer over the first electrically conductive via to expose a portion of the first conductive layer over the first electrically conductive via;
depositing a bond layer over the second conductive layer and the exposed portion of the first conductive layer;
etching the bond layer, the first conductive layer, and the second conductive layer to form
a first standoff, a second standoff, and a third standoff, wherein the first standoff, the second standoff and the third standoff include portions of the first conductive layer, the second conductive layer, and the bond layer,
a first bump stop over the first electrically conductive via, wherein the first bump stop includes portions of the first conductive layer and the bond layer, and
a second bump stop over the second electrically conductive via, wherein the second bump stop includes portions of the first conductive layer, the second conductive layer, and the bond layer;
removing the bond layer from the first bump stop and the second bump stop; and bonding a MEMS wafer to the CMOS wafer;
wherein the bonding the MEMS wafer to the CMOS wafer includes eutecticly bonding the first standoff, the second standoff, and the third standoff to the MEMS wafer.

7. The method of claim 6, further comprising depositing a photoresist over the first standoff, the second standoff, and the third standoff, prior to the removing the bond layer from the first bump stop and the second bump stop.

8. The method of claim 6, wherein the removing the bond layer from the first bump stop and the second bump stop includes etching the bond layer.

9. The method of claim 6, wherein the eutecticly bonding the MEMS wafer to the CMOS wafer forms
a first cavity surrounding a first MEMS device and the first bump stop, and
a second cavity surrounding a second MEMS device and the second bump stop.

10. The method of claim 9, wherein the first cavity includes a first gas pressure and the second cavity includes a second gas pressure.

11. The method of claim 6, wherein
a first MEMS device is between the first standoff and the second standoff, and
a second MEMS device is between the second standoff and the third standoff.

12. An apparatus comprising:
a micro-electro-mechanical system ("MEMS") wafer including a first MEMS device and a second MEMS device;
a complementary metal-oxide semiconductor ("CMOS") wafer underlying the MEMS wafer, wherein the CMOS wafer and the MEMS wafer are bonded together;
a first sealed cavity surrounding the first MEMS device, wherein the first sealed cavity is defined by the MEMS wafer and the CMOS wafer;
a second sealed cavity surrounding the second MEMS device, wherein the second sealed cavity is defined by the MEMS wafer and the CMOS wafer;
a first conductive bump stop on the CMOS wafer and in the first sealed cavity, wherein the first conductive bump stop includes a first height; and
a second conductive bump stop on the CMOS wafer and in the second sealed cavity, wherein the second conductive bump stop includes a second height;
wherein the first conductive bump stop includes one conductive layer and the second conductive bump stop includes two conductive layers;
wherein the second height is larger than the first height,
wherein the first MEMS device and the first conductive bump stop are between a first standoff and a second standoff, and
the second MEMS device and the second conductive bump stop are between a second standoff and a third standoff.

13. The apparatus of claim 12, wherein
the first MEMS device is an accelerometer and the second MEMS device is a gyroscope, or the first MEMS device is a gyroscope and the second MEMS device is an accelerometer.

14. The apparatus of claim 12, wherein a first gas pressure in the first sealed cavity is different than a second gas pressure in the second sealed cavity.

* * * * *